IMPEDANCE-CONTROLLED BLOCKING OSCILLATOR

Filed Jan. 6, 1959 4 Sheets-Sheet 1

INVENTORS.
PAUL JARMOTZ
RAYMOND PEPINSKY
BY
Louis B. Applebaum
ATTORNEY

INVENTORS.
PAUL JARMOTZ
RAYMOND PEPINSKY
BY
Louis B. Applebaum
ATTORNEY

Jan. 8, 1963 P. JARMOTZ ET AL 3,072,863

IMPEDANCE-CONTROLLED BLOCKING OSCILLATOR

Filed Jan. 6, 1959 4 Sheets-Sheet 3

INVENTORS.
PAUL JARMOTZ
RAYMOND PEPINSKY
BY

ATTORNEY

IMPEDANCE-CONTROLLED BLOCKING OSCILLATOR

Filed Jan. 6, 1959

INVENTORS.
PAUL JARMOTZ
RAYMOND PEPINSKY
BY
Louis B. Applebaum
ATTORNEY

United States Patent Office 3,072,863

Patented Jan. 8, 1963

3,072,863

IMPEDANCE-CONTROLLED BLOCKING OSCILLATOR

Paul Jarmotz and Raymond Pepinsky, State College, Pa., assignors, by mesne assignments, to the United States of America as represented by the Secretary of the Navy Filed Jan. 6, 1959, Ser. No. 785,302

1 Claim. (Cl. 331—148)

This invention relates to blocking oscillators and especially to a blocking oscillator whose oscillation is controlled by means of variable impedance.

With respect to their oscillatory condition, conventional blocking oscillators may be classified as one of two types, either free-running or controlled. The controlled type of blocking oscillator is normally biased beyond cut-off, a control pulse being applied to raise the grid voltage above the cut-off value when it is desired to cause the circuit to oscillate. (The free-running type may be controlled in frequency to some extent by the application of control pulses of a slightly higher frequency than the natural frequency of the blocking oscillator but, with reference to its oscillatory state rather than its frequency of oscillation, the oscillator is still considered to be a free-running rather than a controlled type.)

Theoretically, it is possible to control the oscillatory condition of a blocking oscillator by varying the value of one or more of the circuit impedances, such as the plate load impedance, the grid-to-ground impedance, or the cathode-to-ground impedance. In practice, however, this has been difficult to accomplish because the lowest impedance values presented by commonly available variable control impedance circuits are usually too high to exercise a controlling effect on the blocking oscillator.

The present invention comprises a blocking oscillator in which the conditions of oscillation or non-oscillation are obtained by controlling the gain around the regenerative feedback loop. This is accomplished by connecting a variable control impedance in shunt with one of those impedance elements of the oscillator circuit whose variation in value affects the gain around the regenerative feedback loop. By changing the value of the control impedance, the gain of the oscillator circuit can be reduced to a value which permits the oscillator tube to conduct current but not to oscillate, or can be increased to a value which causes the oscillator to oscillate.

A feature of the invention is that the blocking oscillator is operated above the cut-off level, its normal condition being one of non-oscillatory conduction.

An object of the invention is to control the state of oscillation of a blocking oscillator circuit by means of a variable control impedance.

Another object is to control the state of oscillation of a blocking oscillator by control of the amount of gain around its regenerative feedback loop.

A further object is to provide a controllable blocking oscillator whose normal state is one of non-oscillatory conduction.

Other objects and many of the attendant advantages of this invention will be readily appreciated as the same becomes better understood by reference to the following detailed description when considered in connection with the accompanying drawings wherein.

Figure 1:
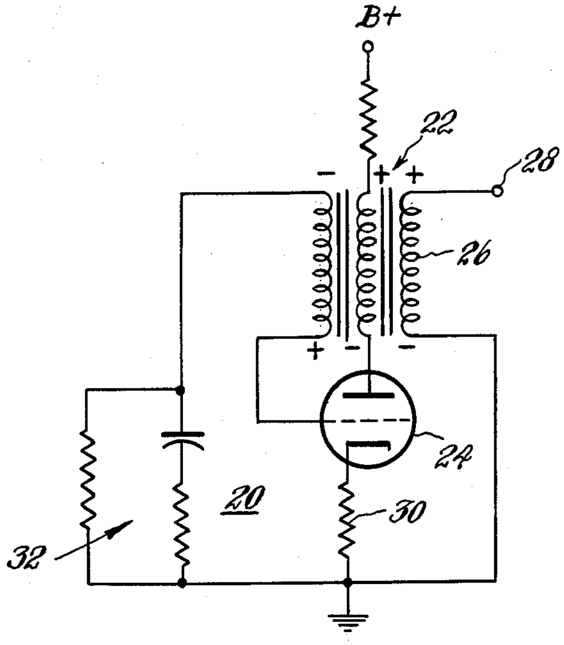
FIG. 1 is a schematic circuit diagram of a conventional blocking oscillator.

A conventional blocking oscillator 20 is illustrated in FIG. 1. The feedback transformer 22 provides regenerative feedback from the plate circuit to the grid circuit of the triode vacuum tube 24. A third winding 26 of the feedback transformer 22 provides output pulses between output terminal 28 and ground.

Figure 2:
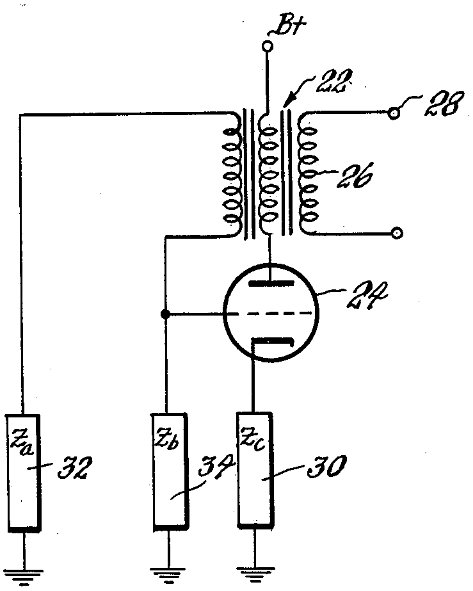
FIG. 2 is a partially blocked schematic circuit diagram of the oscillator shown in FIG. 1.

A generalized schematic of the blocking oscillator 20 of FIG. 1 is illustrated in FIG. 2. The cathode impedance 30 is designated by a block labelled $Z_c$, and the grid impedances by blocks labelled $Z_a$ and $Z_b$. The grid impedances (grid-to-ground impedance 34[$Z_b$] and secondary winding-to-ground impedance 32[$Z_a$] form a voltage-dividing network which determines the amount of feedback voltage applied to the grid. In FIG. 1, $Z_b$ is infinite in value.

Variations in the values of any of these impedances 30, 32, 34 will vary the gain around the regenerative feedback loop of the blocking oscillator 20. Thus, an increase in value of the cathode impedance $Z_c$ will cause a decrease in current through the tube 24, a smaller voltage drop across the primary (or plate) winding of the transformer 22, and a smaller feedback voltage on the grid of the tube 24. If the increase in the value of the cathode impedance is large enough, the voltage fed back to the grid is too small to cause the circuit to oscillate.

Similarly, an increase in the secondary winding-to-ground impedance, $Z_a$, or a decrease in the grid-to-ground impedance, $Z_b$, causes a decrease in the amount of voltage fed back to the grid. Values of either impedance can be found which will decrease the amount of feedback to a point at which oscillation will not occur even though the tube 24 is biased above its cut-off level and is therefore in a normally conductive state.

Figure 3:
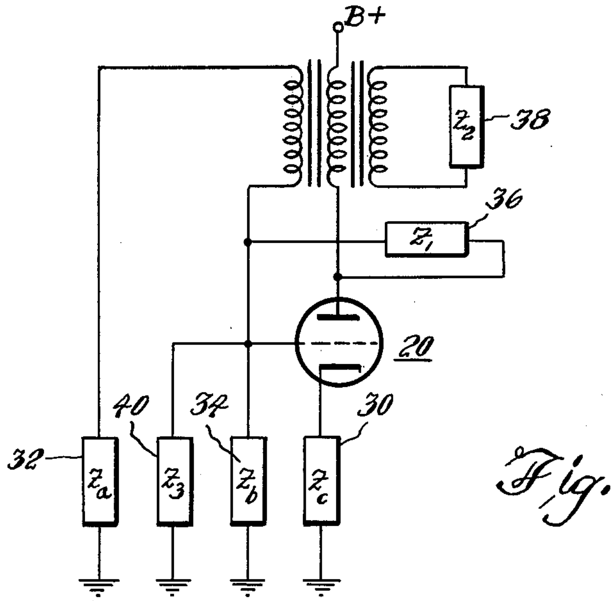
FIG. 3 is a partially blocked schematic circuit diagram illustrating where variable impedances may be connected into the oscillator of FIG. 2 to vary the feedback loop impedance relationships.

FIG. 3 illustrates how the impedance relationships between $Z_a$, $Z_b$ and $Z_c$ may effectively be varied by connecting one or more of the variable control impedances 36($Z_1$), 38($Z_2$) and 40($Z_3$) into the oscillator circuit 20. Connection of one or more of these control impedance $Z_1$, $Z_2$, or $Z_3$ into the oscillator circuit 20, as shown, places a variable impedance in the regenerative feedback loop, the combination of the variable impedance with all or a portion of the original feedback loop impedance varying the relationships between the original feedback loop impedances and, therefore, altering the gain around the feedback loop. If, now, each of the newly connected control impedances is variable between two values, for example, the resultant impedance stemming from its combination with all or a portion of the original feedback loop impedance will similarly be variable between two values. Proper impedance values can be selected which will cause the oscillator circuit 20 either to go into a state of oscillation or to remain in a state of non-oscillatory conduction.

Figure 4:
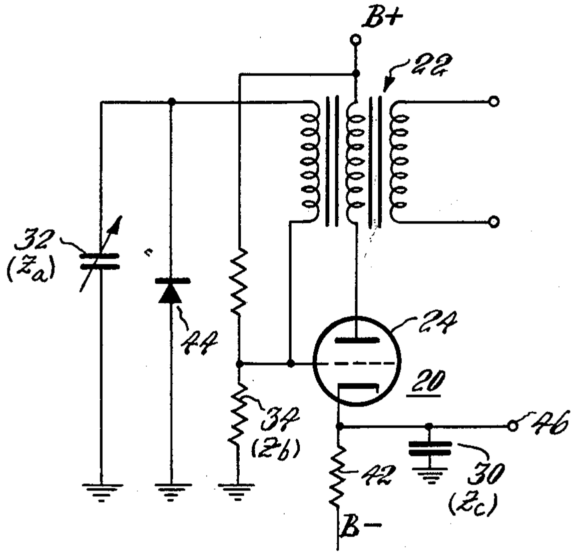
FIG. 4 is a schematic circuit diagram of a basic blocking oscillator circuit which may be employed in this invention.

A blocking oscillator circuit 20 which can be employed in this invention is illustrated in FIG. 4. Here the tube 24 is biased to a normally conducting condition by connecting the cathode to B− through a cathode resistor 42 and placing the proper positive voltage on the grid by means of a voltage divider between B+ and ground, the voltage divider utilizing $Z_b$ as one of its elements. $Z_a$ in this embodiment comprises a variable capacitor 32. The crystal diode 44 is employed to prevent the ground side of the grid winding from going below ground potential when the oscillator blocks, thereby making the full voltage of the grid winding available to the grid electrode.

Figure 5:
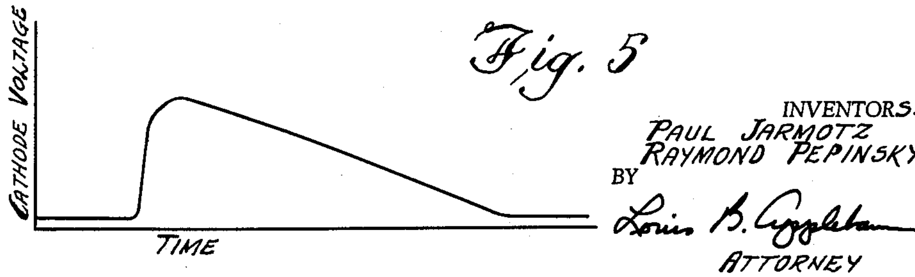
FIG. 5 is a graph illustrating the output pulse of the oscillator of FIG. 4 as it appears across the cathode impedance.

When the tube 24 oscillates, a positive-going sawtooth voltage (see FIG. 5) appears between the output terminal 46 and ground. The leading edge of the pulse represents the charging of cathode impedance 30($Z_c$) and the traling edge represents the discharge of $Z_c$ through the cathode resistor 42. This discharge ceases when the grid-cathode voltage reaches the value required for the normal quiescent current to flow through the tube 24. During the discharge of $Z_c$, the tube 24 is cut off.

Figure 6:
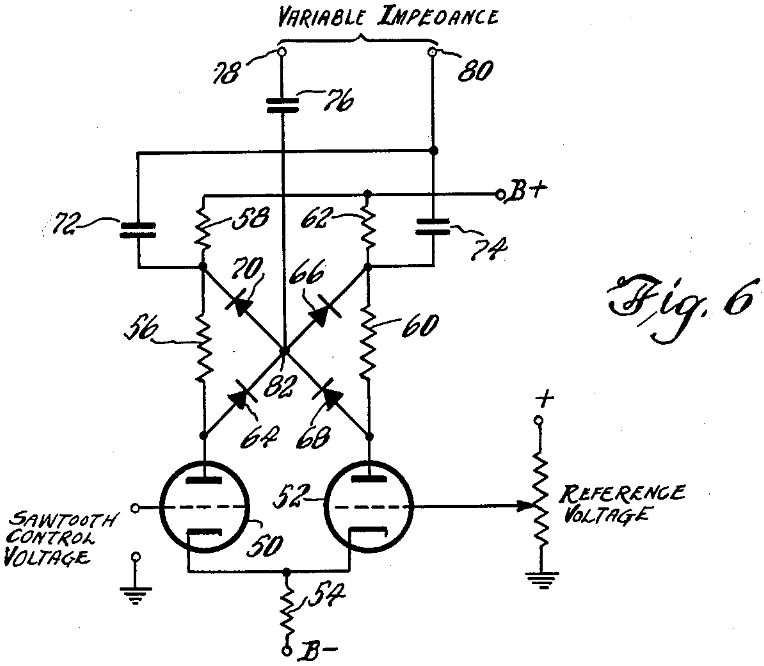
FIG. 6 is a schematic circuit diagram of one type of variable impedance which may be employed in this invention.

FIG. 6 shows a variable control impedance which may be employed with this invention. Cathode-coupled triodes 50 and 52 and their associated circuitry comprise a balance differential amplifier. The triodes 50 and 52 are connected to a source of negative supply voltage through a common cathode 54. Triode 50 is connected to a source of positive supply voltage through series resistors 56 and 58 and triode 50 is similarly connected through resistors 60 and 62. Resistors 56 and 58 are equal in value to resistors 60 and 62, respectively.

A pair of diodes 64 and 66 are connected in series, or tandem, from the plate of triode 50 to the junction between resistors 60 and 62, the forward current direction being from the triode plate to the resistor junction. Similarly, a second pair of diodes 68 and 70 are connected from the plate of triode 52 to the junction between resistors 56 and 58. The mid-points of the series connected diode arms, or branches, are joined together. Capacitors 72, 74 and 76 are coupling condensers to the output terminals 78 and 80, the output being taken across the upper two diodes 66 and 70 in parallel.

The diodes are shown as crystals although any type of diode such as a vacuum tube diode may be employed.

In operation, the state of conduction or non-conduction through the series connected diode arms determines the value of impedance which appears at the output terminals 78 and 80.

The control voltage at the grid of triode 50 may, for example, be a sawtooth voltage, while the input to the grid of triode 52 may be a fixed D.C. reference potential derived from a source and as a potentiometer across a positive D.C. supply. At the condition of balance, or coincidence of the value of the sawtooth voltage with the D.C. potential applied to the grid of triode 52, both triodes draw equal currents and the voltage drops across analogous plate resistors, e.g. 56 and 60, are equal. The diodes 64, 66, 68 and 78 are therefore under reverse polarity and no current flows through them. The impedance across any diode at this time is high (the back impedance of the diode).

When the sawtooth control voltage is below the comparison D.C. potential, triode 50 draws less current than triode 52. The voltage drops through resistors 56 and 58 are smaller than the drops through resistors 60 and 62; therefore, the voltage at the anode of diode 64 is higher than the voltage at the cathode of diode 66 and the voltage at the cathode of diode 70 is higher than the voltage at the anode of diode 68. Conduction takes place through diodes 64 and 66. The output impedance is now the forward impedance of diode 66, which is a low value of impedance.

When the sawtooth voltage rises above the value of the comparison D.C., voltage conditions cause conduction to occur through diodes 68 and 70 so that the output impedance is the forward impedance through diode 70.

Figure 7:
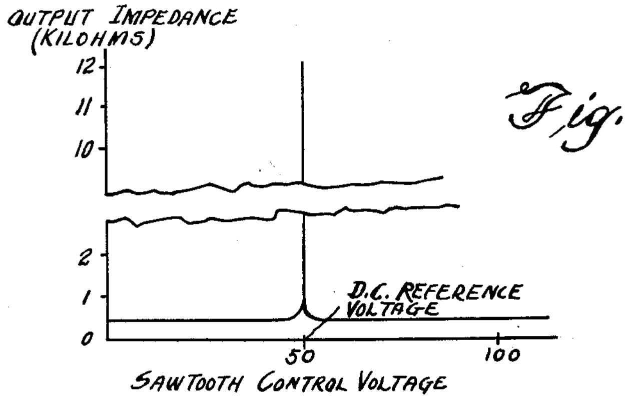
FIG. 7 is a graph showing the variation of output impedance with increase in control voltage for the circuit of FIG. 6.

A graph illustrating the variation in output impedance for a sawtooth control voltage which rises from 0 to +100 volts and for a D.C. reference voltage of +50 volts is shown in FIG. 7. It is apparent that at the coincidence point there is a sudden variation in the value of the output impedance from a low to a high value.

Figure 8:
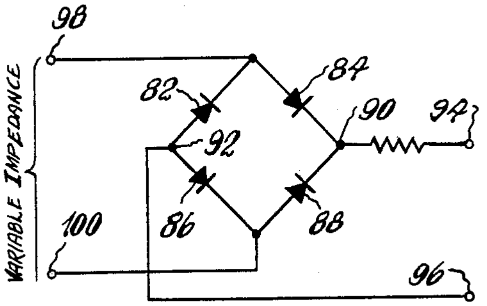
FIG. 8 is a schematic circuit diagram of another type of variable impedance which may be employed in this invention.

Another type of control impedance which may be employed is illustrated in FIG. 8. Here a bridge rectifier comprising four diodes 82, 84, 86 and 88 one in each arm of the bridge, is employed. The control voltage, which may, for example, be a sawtooth or a rectangular wave rising from some negative to some positive value, is placed across the bridge at points 90 and 92. When input terminal 94 is negative with respect to input terminal 96, the diodes 82, 84, 86 and 88 are all conductive and the output impedance at terminals 98 and 100 is low. When input terminal 94 is positive with respect to input terminal 96, conduction through the diodes ceases and the output impedance jumps to a high value, as shown in FIG. 9.

Figure 9:
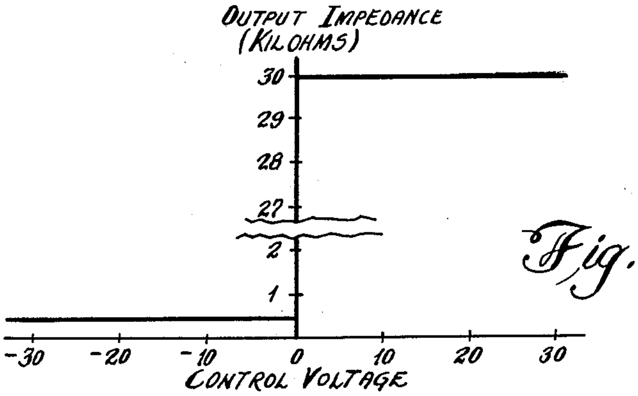
FIG. 9 is a graph showing the variation of output impedance with increase in control voltage for the circuit of FIG. 8.

Thus, as illustrated in the graphs of FIGS. 7 and 9, the circuits of FIGS. 6 and 8 constitute controllable variable impedances which can be made to vary abruptly between a low and a high value of impedance.

Figure 10:
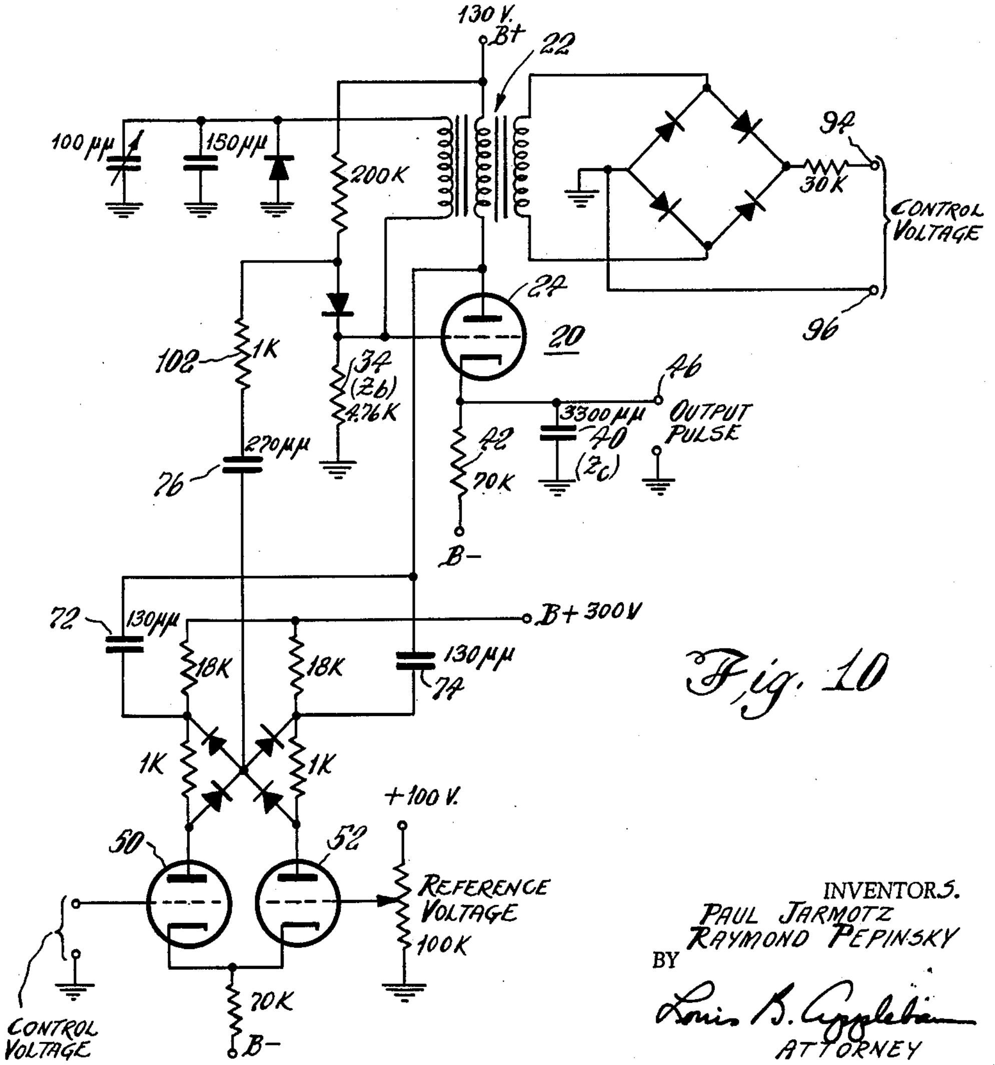
FIG. 10 is a schematic circuit diagram of an embodiment of the invention.

FIG. 10 illustrates one way in which the control impedances of FIGS. 6 and 8 may be connected into the blocking oscillator circuit of FIG. 4. In terms of FIG. 3, the control impedance of FIG. 6 is now $Z_1$ and the control impedance of FIG. 8 is now $Z_2$. The operation of the blocking oscillator may be controlled by these control impedances either jointly or severally. Resistor 102 increases the effectiveness of the control impedance $Z_1$ on the blocking oscillator by reducing the phase shifts introduced by the small coupling condensers 72, 74 and 76. The control impedance should theoretically present a pure resistance to the blocking oscillator for best results. The coupling condensers should be large enough to provide good coupling between the control impedance and the blocking oscillator, yet small enough to minimize slow-down effects in the response time of the control impedance circuit.

In a typical embodiment, the diodes may all be IN34 crystals, the vacuum tubes may all be type 7F8, and typical values for other components are indicated in FIG. 10.

Obviously many modifications and variations of the present invention are possible in the light of the above teachings. It is therefore to be understood that within the scope of the appended claim the invention may be practiced otherwise than as specifically described.

We claim:

An impedance-controlled blocking oscillator comprising, in combination: a blocking oscillator biased to operate in a normal state of non-regenerative conduction, said oscillator comprising a unidirectional current device having at least an anode, a cathode and a control electrode, a feedback transformer having a plurality of windings, a cathode impedance connected between said cathode and ground, and a grid impedance network connected to said control electrode and ground, the primary winding of said transformer being connected between said anode and a source of supply voltage for said unidirectional current device, and a second winding being connected between said control electrode and said grid impedance network, a regenerative voltage thereby being fed back to said control electrode from said anode; and variable-impedance means connected across a third winding of said transformer, said variable-impedance means being controllable to shift its impedance between two values, one of which maintains said oscillator in its normal state of non-regenerative conduction and the other of which causes said oscillator to go into a state of oscillation.

References Cited in the file of this patent

UNITED STATES PATENTS

| | | |
|---|---|---|
| 2,555,368 | Philpott | June 5, 1951 |
| 2,605,407 | Perkins | July 29, 1952 |
| 2,924,786 | Talkin et al. | Feb. 9, 1960 |
| 2,939,088 | Hodges | May 31, 1960 |